(12) United States Patent
Miyatake

(10) Patent No.: US 6,191,858 B1
(45) Date of Patent: Feb. 20, 2001

(54) POSITION DETECTING METHOD AND APPARATUS USING OPTICAL SYSTEM WITH OBLIQUE OPTICAL AXES

(75) Inventor: Tsutomu Miyatake, Kiyose (JP)

(73) Assignee: Sumitomo Heavy Industries, Ltd., Tokyo (JP)

( * ) Notice: Under 35 U.S.C. 154(b), the term of this patent shall be extended for 0 days.

(21) Appl. No.: 09/257,245

(22) Filed: Feb. 25, 1999

(30) Foreign Application Priority Data

Feb. 26, 1998 (JP) .................................................. 10-045508

(51) Int. Cl.$^7$ ...................................................... G01N 11/00
(52) U.S. Cl. ............................................ 356/399; 356/401
(58) Field of Search .................................. 356/399, 400, 356/401

(56) References Cited

U.S. PATENT DOCUMENTS 4,728,193 * 3/1988 Bartelt et al. ........................ 356/356
5,137,349 * 8/1992 Taniguchi et al. ................... 356/401

* cited by examiner

Primary Examiner—Robert Kim

(74) Attorney, Agent, or Firm—Arent Fox Kintner Plotkin & Kahn, PLLC

(57) ABSTRACT

A wafer with an exposure surface having a wafer mark formed thereon for scattering incidence light for position alignment and an exposure mask with a mask surface having a mask mark formed thereon for scattering incidence light for position alignment, are disposed facing each other with a predetermined distance being set between the exposure surface and the mask surface. An illumination optical system applies illumination light to the wafer mark and the mask mark along an optical axis which is oblique relative to the exposure surface. An observation optical system focuses scattered light from the wafer mark and mask mark on a light reception surface. The optical axis of the observation optical system is slanted in a direction opposite to the direction of the optical axis of the illumination optical system, relative to a normal direction to the exposure surface of the wafer. Regular reflection light of the illumination light applied to the wafer and the mask is set so as not to become incident upon the light reception surface. A controller controls to detect a positional relation between the wafer and the mask in accordance with images formed by scattered light from the wafer mark and mask mark. A contract between a background and an image formed by scattered light from alignment marks is increased to easily detect the positions of the wafer and mask.

6 Claims, 8 Drawing Sheets

POSITION DETECTING METHOD AND APPARATUS USING OPTICAL SYSTEM WITH OBLIQUE OPTICAL AXES

This application is based on Japanese patent application HEI 10-45508 filed on Feb. 26, 1998, the whole contents of which are incorporated herein by reference.

BACKGROUND OF THE INVENTION a) Field of the Invention

The present invention relates to a position detecting apparatus and a position detecting method for position alignment. More particularly, the invention relates to a position detecting apparatus using an observation optical system having an oblique optical axis relative to the surface of an object, and a position detecting method using such a position detecting apparatus.

b) Description of the Related Art

A vertical detection method is known as a method of detecting the positions of marks on a wafer and a mask by using an aligner having a lens system combined with an image processing system. The vertical detection method observes position detecting marks along a direction perpendicular to the mask surface.

A chromatic bifocal method is known as a focussing method used by the vertical detection method. The chromatic bifocal method observes a wafer mark formed on a wafer and a mask mark formed on a mask by using light of different wavelengths and chromatic aberrations of the lens system, and focuses the images of the marks on the same flat plane. A wafer mark and a mask mark are hereinafter collectively called an alignment mark. An absolute precision of position detection by the chromatic bifocal method can be made high because the optical resolution of the lens system can be set high in principle.

However, since an alignment mark is observed vertically, a part of the optical system enters the exposure area. Since the optical system shields exposure light, it is necessary to retract the optical system from the exposure area when exposure light is applied. A time required for retracting the optical system lowers throughput. The alignment mark cannot be observed during the exposure, which is one of the reasons of lowering an alignment precision during the exposure.

An oblique detection method capable of solving the above-described problem associated with the vertical detection method is disclosed in Japanese Patent Laid-open Publication HEI 9-27449.

FIG. 8 is a schematic perspective view of a position detecting apparatus for the oblique detection method disclosed in the Publication HEI 9-27449. This position detecting apparatus is constituted of a wafer/mask holder unit 110 and an optical system 120.

The wafer/mask holder unit 110 is constituted of a wafer holder 115 and a mask holder 116. When position alignment is performed, a wafer 111 is held on an upper surface of the wafer holder 115 and a mask 112 is held on a lower surface of the mask holder 116. The wafer 111 and mask 112 are disposed facing each other with a predetermined gap being set between the upper surface (exposure surface) of the wafer and the lower surface (mask surface) of the mask. Wafer marks for position detection are formed on the exposure surface of the wafer 111, and a mask mark for position detection is formed on the mask surface of the mask 112.

The wafer mark 113 and mask mark 114 have edges from which incidence light is scattered. When light is incident upon these marks, light incident upon the marks are scattered whereas light incident upon another area is regularly reflected.

The optical system 120 is constituted of an image detector 121, a lens 122, a half mirror 123, and a light source 124.

The optical system 120 is disposed in such a manner that the optical axis 125 thereof is oblique relative to the exposure surface of the wafer 111. Illumination light radiated from the light source 124 is reflected by the half mirror 123 in a direction of the optical axis 125, passes through the lens 122, and becomes obliquely incident upon the exposure surface. The light source 124 is positioned at the focal point on the image side so that illumination light radiated from the light source 124 is collimated and becomes parallel light fluxes. The intensity of illumination light of the light source 124 is made adjustable.

Of light fluxes scattered at the edges of the wafer marks 113 and mask mark 114, the light fluxes incident upon the entrance pupil of the lens 122 is converged by the lens 122 and focussed on a light reception surface of the image detector 121. Since the optical axes of the illumination optical system and the observation optical system are disposed obliquely, it is not necessary to dispose each optical system just above an exposure area of the exposure surface. Therefore, exposure can be performed without retracting the exposure system from above the exposure area. It is also possible to observe alignment marks during exposure.

In the position detecting apparatus shown in FIG. 8, illumination light is applied to the alignment marks 113 and 114 after being reflected by the half mirror 123 and penetrating through the lens 122. The intensity of the illumination light decreases by about a half when the half mirror 123 reflects it. Although most of the illumination light transmits through the lens 122, a fraction of the illumination light is reflected by the surface of the lens 122. This reflected light produces flare so that the background level of light incident upon the light reception surface of the image detector 121 is raised. A contrast is therefore lowered between the background and an image formed by light scattered from the alignment marks.

Another problem is that the intensity of light propagating toward the image detector 121 is lowered by about a half by the half mirror 121, because light scattered by the alignment marks reaches the image detector 121 after passing through the half mirror 123. The intensity of light scattered and reached the image detector 121 may be raised by making the intensity of illumination light high. With this method, however, flare of illumination light increases at the same time. Therefore, this method is not effective for increasing the contrast between the background and an image formed by light scattered and reached the image detector 121.

SUMMARY OF THE INVENTION

It is an object of the present invention to provide a position detecting apparatus capable of increasing the contrast between a background and an image formed by light scattered from alignment marks and making it easy to detect positions.

It is an object of the present invention to provide a position detecting method capable of increasing the contrast between a background and an image formed by light scattered from alignment marks and making it easy to detect positions.

According to one aspect of the present invention, there is provided a position detecting apparatus comprising: an illumination optical system for applying illumination light to a wafer mark and a mask mark both for scattering incidence light for position alignment, the wafer mark being formed on an exposure surface of a wafer, the mask mark being formed on a mask surface of an exposure mask, and the illumination light being applied along an optical axis which is oblique relative to the exposure surface; an observation optical system having a light reception surface on which scattered light from the wafer mark and the mask mark is focussed, an optical axis of the observation optical system being slanted in a direction opposite to a direction of an optical axis of the illumination optical system, relative to a normal direction to the exposure surface of the wafer, and regular reflection light of the illumination light applied to the wafer and the mask from the illumination optical system being set so as not to become incident upon the light reception surface; and control means for controlling to detect a positional relation between the wafer and the mask in accordance with images formed by the observation optical system by using the scattered light from the wafer mark and the mask mark.

According to another aspect of the present invention, there is provided a position detecting method comprising the steps of: disposing a wafer with an exposure surface having a wafer mark formed thereon for scattering incidence light for position alignment and an exposure mask with a mask surface having a mask mark formed thereon for scattering incidence light for position alignment, the wafer and the exposure mask being faced each other with a predetermined distance being set between the exposure surface and the mask surface; applying illumination light from an illumination optical system to the wafer mark and the mask mark along an optical axis which is oblique relative to the exposure surface; observing images formed by scattered light from the wafer mark and the mask mark with an observation optical system, the observation optical system having a light reception surface on which scattered light from the wafer mark and the mask mark is focussed, an optical axis of the observation optical system being slanted in a direction opposite to a direction of an optical as of the illumination optical system, relative to a normal direction to the exposure surface of the wafer, and regular reflection light of the illumination light applied to the wafer and the mask from the illumination optical system being set so as not to become incident upon the light reception surface; and controlling to detect a positional relation between the wafer and the mask in accordance with observation results at the observing step.

Since illumination light does not pass through optical components of an observation optical system, it is possible to eliminate the influence of flare which is otherwise produced by the optical components and to increase the contrast between an image and a background. Since forward scattered light is observed, scattered light stronger than backward scattered light can be observed and a brighter image can be obtained.

Since a contrast between an image and a background can be raised, positions can be detected easily.

DETAILED DESCRIPTION OF THE PREFERRED EMBODIMENTS

Figure 1:
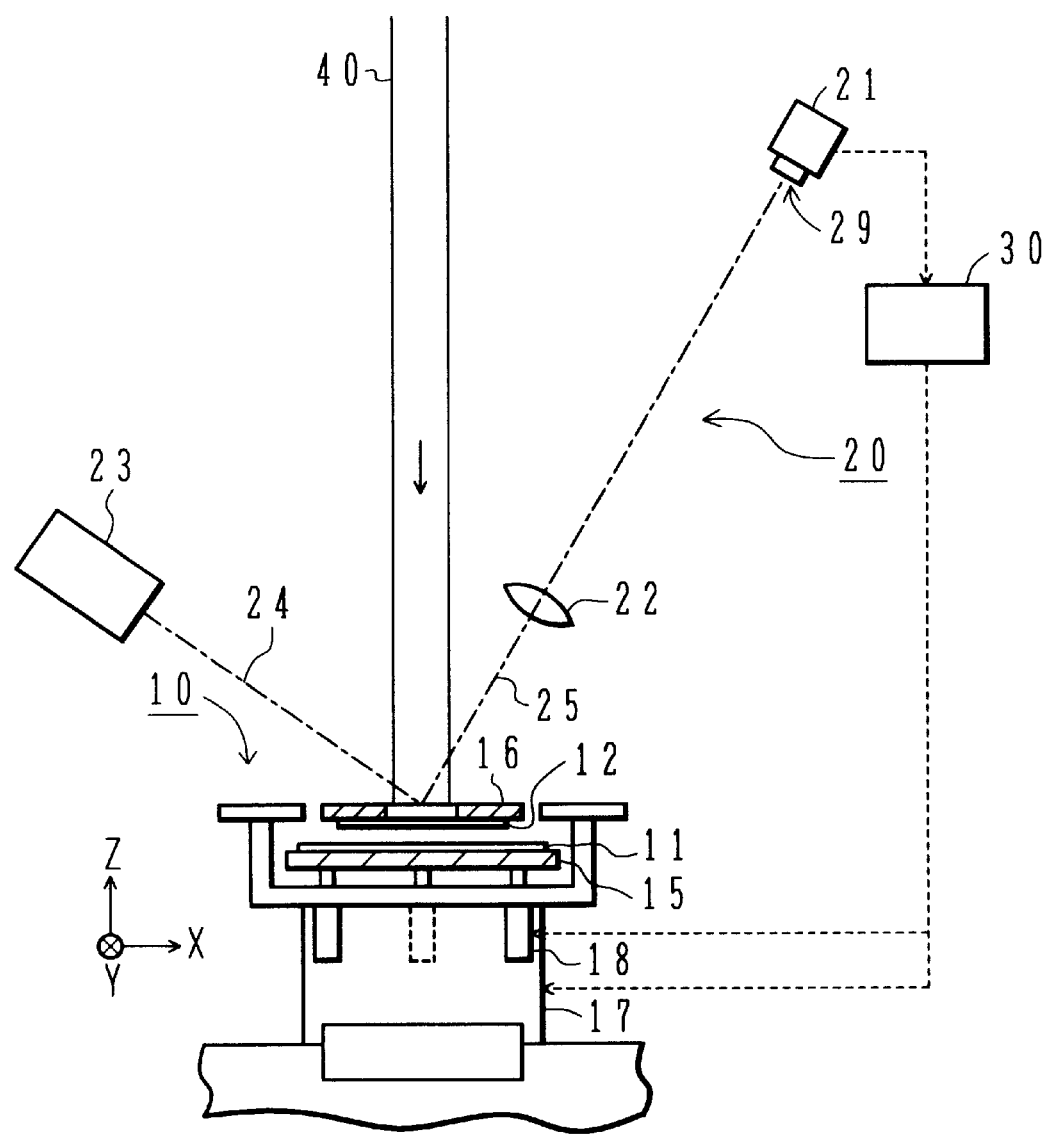
FIG. 1 is a cross sectional view showing the outline of a position detecting apparatus according to an embodiment of the invention.

FIG. 1 is a schematic cross sectional view of a position detecting apparatus according to an embodiment of the invention.

The position detecting apparatus of the embodiment is constituted of a wafer/mask holder unit 10, an observation optical system 20, an illumination optical system 23, and a controller 30.

The wafer/mask holder unit 10 is constituted of a wafer holder 15, a mask holder 16, and driving mechanisms 17 and 18. When position alignment is performed, a wafer 111 is held on an upper surface of the wafer holder 15 and a mask 12 is held on a lower surface of the mask holder 16. The wafer 11 and mask 12 are disposed facing each other with a predetermined gap being set between the upper surface (exposure surface) of the wafer 11 and the lower surface (mask surface) of the mask 12. Wafer marks for position detection are formed on the exposure surface of the wafer 11, and a mask mark for position detection is formed on the mask surface of the mask 12.

The driving mechanism 17 can move either the wafer holder or mask holder 16 to change the relative position of the wafer 11 and mask 12 in an exposure surface area. The driving mechanism 18 can move the wafer holder 15 to change the distance between the exposure surface of the wafer 11 and the mask surface of the mask 12. In an X-Y-Z coordinate system, the X-axis is defined as a direction from the left to the right in FIG. 1, the Y-axis is defined as a direction perpendicular to the drawing sheet from the front surface to the back surface, and the Z-axis is defined as a direction normal to the exposure surface. The driving mechanism 17 adjusts the positional relation between the wafer 11 and mask 12 in the X-axis direction, in the Y-axis direction, and in a rotation direction ($\theta_z$ direction) about the Z-axis. The driving mechanism 18 adjusts the positional relation therebetween in the Z-axis direction and in the rotation (flapping) directions ($\theta_x$ and $\theta_y$ directions) about the X- and Y-axes.

The observation optical system 20 is constituted of an image detector 21 and a lens 22. The illumination optical system 23 applies illumination light to wafer marks formed on the wafer 11 and a mask mark formed on the mask 12. Light scattered by the wafer and mask marks enter the lens 22 and an image is formed by the scattered light on a light reception surface 29 of the image detector 21. For example, the Köhler illumination system, the critical illumination system, and the laser illumination system can be used as the illumination optical system 23.

An optical axis 24 of illumination light and an optical axis 25 of the lens 22 are parallel to the X-Z plane and oblique relative to the exposure surface. The optical axes 24 and 25 are slanted in opposite directions relative to the direction (Z-axis direction) normal to the exposure surface. The optical axes 24 and 25 are also disposed such that regular reflection light from the exposure surface of the wafer 11 and from the surface of the mask 12 will not enter the lens 22. Regular reflection is one of reflection states in which most components of incidence light are reflected in the same direction.

The image detector 21 photoelectrically converts an image formed by light scattered from the wafer 11 and mask 12 and focussed on the light reception surface 29, into an image signal which is sent to the controller 30.

The controller 30 processes the image signal input from the image detector 21 to detect the relative position between the wafer 11 and mask 12. The controller 30 sends a control signal to the driving mechanisms 17 and 18 to make the wafer 11 and mask 12 have a predetermined relative position. In accordance with this control signal, the driving mechanism 17 moves the mask holder 16 in parallel in the X-Y plane and rotates it about the Z-axis direction. In accordance with the control signal, the driving mechanism 18 moves the wafer holder 15 in parallel in the Z-axis direction and finely rotates it about the X- and Y-axes.

Figure 2A:
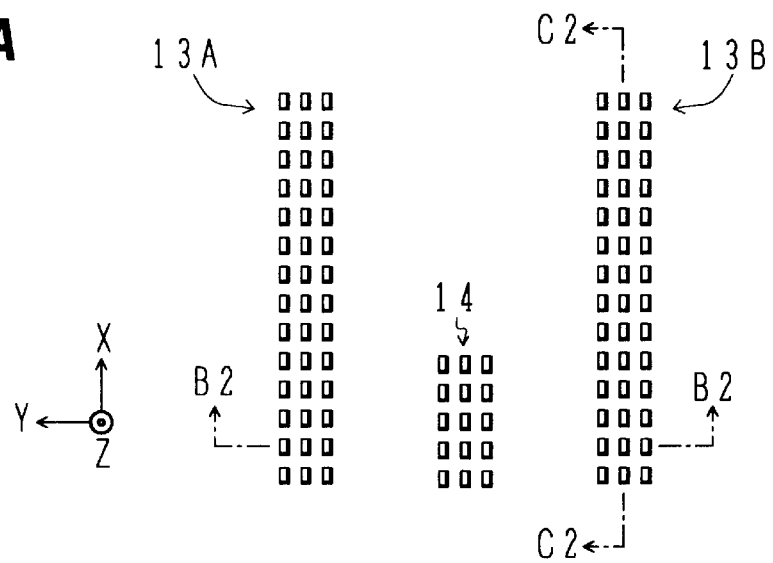
FIG. 2A is a plan view showing wafer marks and a mask mark.

FIG. 2A is a plan view showing an example of a positional relation between position alignment wafer marks 13A and 13B and a position alignment mask mark 14 respectively formed on the wafer 11 and mask 12 shown in FIG. 1. Each of the wafer marks 13A and 13B is formed by disposing rectangular patterns in a matrix form, three patterns in the Y-axis direction and fourteen patterns in the X-axis direction. The other mask pattern 14 is formed by disposing similar rectangular patterns in a matrix form, three patterns in the Y-axis direction and five patterns in the X-axis direction. In the state of position alignment completion, the mask mark 14 is positioned generally at the center of the two wafer marks 13A and 13B.

The longer side of each rectangular pattern of the wafer marks 13A and 13B and mask mark 14 is parallel to the X-axis direction, and the shorter side is parallel to the Y-axis. For example, the length of the longer side of each rectangular pattern is 2 μm and the length of the shorter side is 1 μm. The pitch between rectangular patterns in each mark is, for example, 4 μm both in the X- and Y-axis directions. The distance between the centers of the wafer marks 13A and 13B is 56 μm.

Figure 2B:
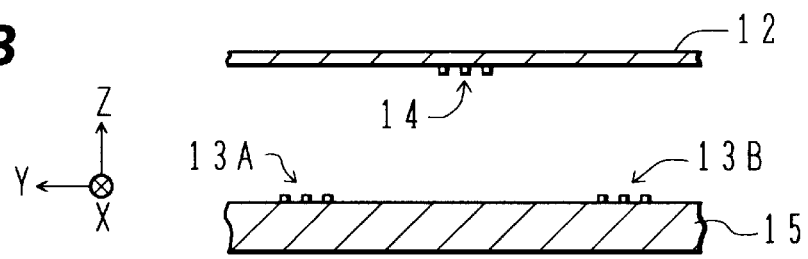
FIGS. 2B and 2C are cross sectional views of the marks.

FIG. 2B is a cross sectional view of the alignment marks taken along one-dot chain line B2—B2 shown in FIG. 2A. The wafer marks 13A and 13B are formed, for example, by patterning an SiN film, a polysilicon film or the like formed on the exposure surface. The mask mark 14 is formed, for example, by patterning a $Ta_4B$ film formed on the mask surface of the membrane 12 made of SiC or the like.

Figure 2C:
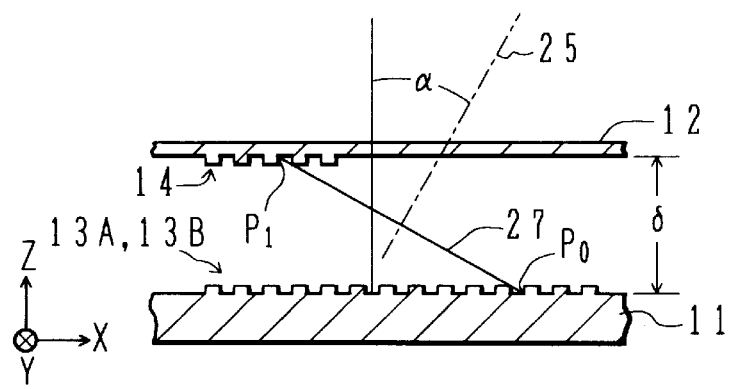

FIG. 2C is a cross sectional view of the alignment marks taken along one-dot chain line C2—C2 shown in FIG. 2A. Illumination light incident upon the wafer marks 13A and 13B and mask mark 14 is scattered at the shorter side edge of each rectangular pattern. Illumination light incident upon an area other than the edges is regularly reflected and does not enter the lens 22 shown in FIG. 1. Therefore, the image detector 21 can detect only light scattered from the edges of the alignment marks.

Scattered light from a plurality of points on a single flat plane perpendicular to the optical axis 25 in the object space of the lens 22 shown in FIG. 1 is focussed on the light reception surface 29 of the image detector 21 at the same time. A flat plane constituted of a set of object points in the object space to be focussed on the light reception surface is called an "object plane".

Referring to FIG. 2C, among the light scattered from edges of the wafer marks 13A and 13B and mask mark 14, the light scattered from the edges on the object plane 27 is focussed on the light reception surface. However, the light scattered from the edges not on the object plane 27 is not focussed on the light reception surface, and an image formed by light scattered from edges remoter from the object plane becomes more out of focus. Therefore, an image formed by light scattered from the edge of each mark nearest to the object plane becomes most clear, whereas an image formed by light scattered from edges remoter from the object plane becomes more out of focus.

Figure 3:
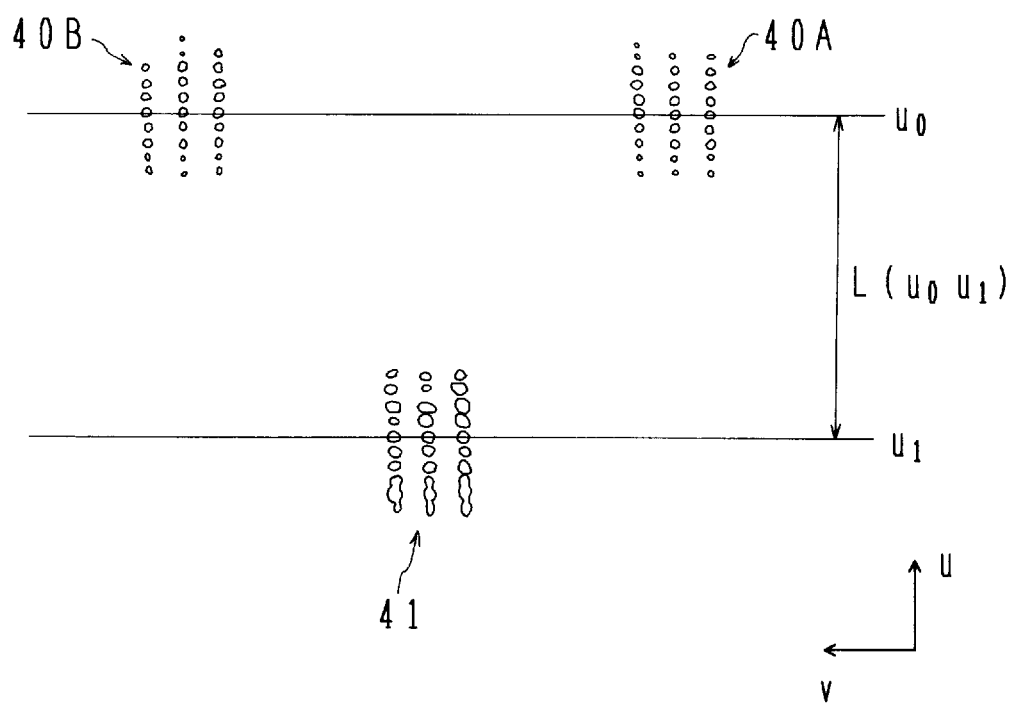
FIG. 3 is a diagram sketched from an image of wafer marks and a mask mark formed by scattered light.

FIG. 3 is a diagram sketched from an image on the light reception surface formed by scattered light from edges of the wafer marks 13A and 13B and mask mark 14. A u-axis shown in FIG. 3 corresponds to a direction of intersection between the object plane 27 and the X-Z plane shown in FIG. 2C, and a v-axis corresponds to the Y-axis shown in FIG. 2C. Images 40A and 40B formed by scattered light from the wafer marks 13A and 13B appear spaced apart in the v-axis direction, and an image 41 formed by scattered light form the mask mark 14 appears between the images 13A and 13B.

Since scattered light from both front and back edges of each rectangular pattern is detected, two point-like partial images are formed for each rectangular pattern. A partial image formed by scattered light from the edge nearest to the object plane 27 shown in FIG. 2C becomes clear, and a partial image formed by scattered light from the edge remoter from the object plane 27 in the u-axis direction becomes more out of focus. As shown in FIG. 2C, since the observation optical axis 25 is slanted relative to the exposure surface, the position of the images 40A and 40B formed by scattered light from the wafer marks is different in the u-axis direction from the position of the image 41 formed by scattered light from the mask mark.

By moving the wafer holder 15 and mask holder 16 shown in FIG. 1 to set the image 41 formed by scattered light from the mask mark at the center of the two images 40A and 40B in the v-axis direction, it becomes possible to align the positions of the wafer 11 and mask 12 in the Y-axis direction, i.e., in a direction of intersection between the object plane and exposure surface.

With the position detecting apparatus shown in FIG. 1, the wafer marks and mask mark are observed obliquely so that it is not necessary to dispose the observation optical system 20 and illumination optical system 23 in an optical path of exposure light 40. It is therefore unnecessary to retract the observation optical system 20 and illumination optical system 23 from an exposure area during exposure. Further, the positions of the wafer and mask can be detected always even while the wafer is exposed after the position alignment.

Figure 8:
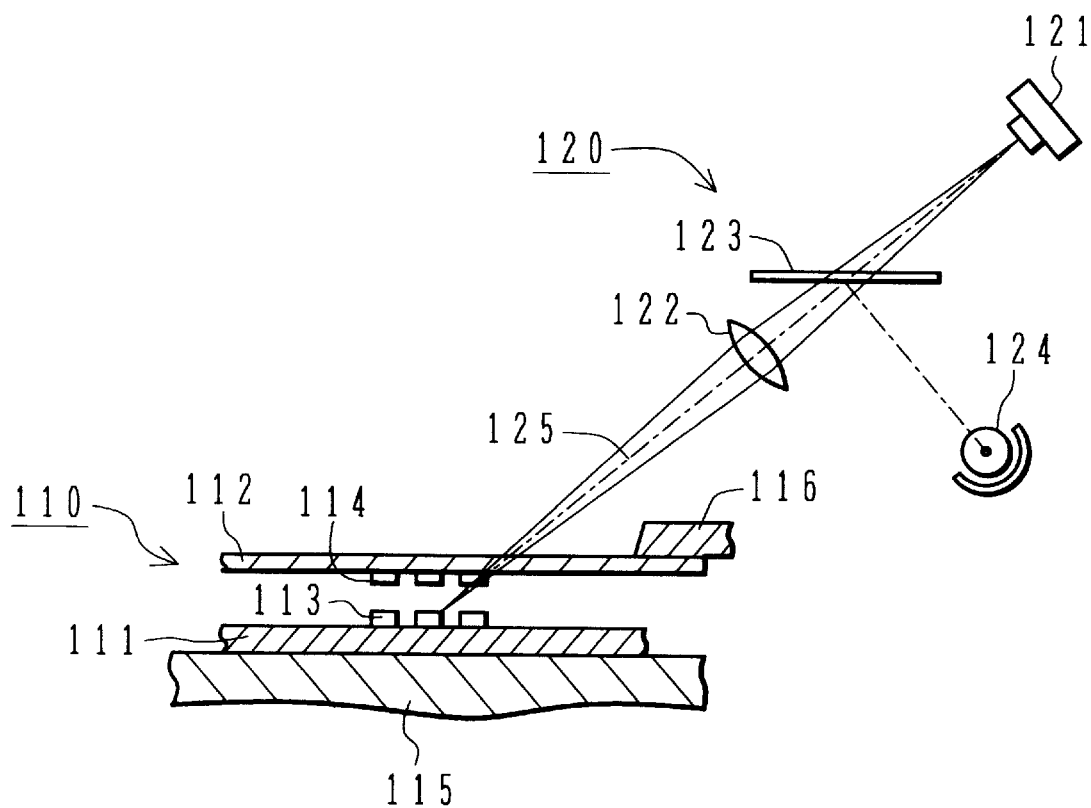
FIG. 8 is a schematic front view of a conventional oblique detecting apparatus.

Furthermore, since illumination light is applied to the alignment marks without passing through the observing lens 22, flare is not produced which may otherwise be formed by illumination light reflected from the surface of the lens 22. It is therefore possible to prevent the contrast between a background and an image formed by scattered light from being lowered. The half mirror 123 shown in FIG. 8 is not used so that there is no attenuation of the illumination light and scattered light to be caused by the half mirror 123.

Still further, the optical axis 24 of illumination light and the optical axis 25 of the observation lens 22 are slanted in opposite directions relative to a normal to the exposure surface. Namely, the lens 22 observes forward scattered light from the alignment marks. Generally, the intensity of forward scattered light from fine particles of about 1 μm attached on a flat plane is larger than the intensity of backward scattered light (refer to Akiyama, et. al., Developments on Fine Particle Detecting Apparatus through Oblique Illumination∩Oblique Detection", Journal of the Japan Society of Precision Engineering, Vol. 63, No. 10, 1997). Backward scattered light is scatted light obtained when the optical axis of illumination light and the optical axis of the observation lens are slanted in the same direction relative to a normal to the exposure surface. In this embodiment, since the forward scattered light is observed, a brighter image can be formed.

Figure 4:
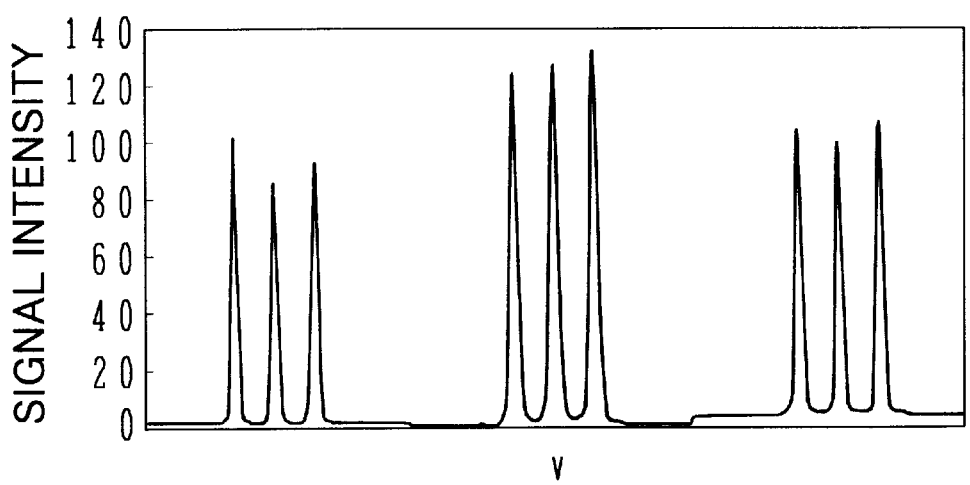
FIG. 4 is a graph showing image signals of a comparison example which illustrates the embodiment more specifically.

FIG. 4 shows an example of image signals obtained by the image detector 21 under the conditions that the wafer marks are made of SiN and the mask mark is made of $Ta_4B$. The abscissa corresponds to the u-axis shown in FIG. 3, and the ordinate represents a light intensity. These image signals are obtained by scanning the light reception surface shown in FIG. 3 and synthesizing the image signals corresponding to the scan lines at the highest in-focus states of the images 40A and 40B and image 41. Three peaks corresponding to the mask mark appear generally at the center, and three peaks corresponding to the wafer mark appear on both sides of the mask mark.

An example of the method of detecting a relative position between the mask mark and wafer marks from the waveforms shown in FIG. 4 will be briefly described. While the peak waveforms corresponding to the mask mark are moved in the v-axis direction, the correlation coefficients between the mask mark peak waveforms and the wafer mark peak waveforms of each wafer mark are calculated. A motion amount which gives the highest correlation coefficient corresponds to a distance between centers of the wafer mark and mask mark.

By moving the wafer and mask to make equal the distance from the center of the peak waveforms corresponding to the mask mark to the center of the peak waveforms corresponding to each of the wafer marks, position alignment can be performed in the Y-axis direction shown in FIG. 1.

The relative position between the wafer and mask may be obtained through pattern matching between the images of the mask mark and wafer mark by moving in parallel the two-dimensional signals shown in FIG. 3 in the u-axis and v-axis directions. Distances between the images in the u-axis and v-axis directions can be obtained through pattern matching of two-dimensional images.

Next, a method of measuring a distance between a wafer and a mask will be described. Referring to FIG. 3, a position $u_0$ where the images 40A and 40B formed by scattered light from the wafer marks are in the highest in-focus state in the u-axis direction, corresponds to an intersection $P_0$ between the object plane 27 and exposure surface shown in FIG. 2C. Referring again to FIG. 3, a position $u_1$ where the image 41 formed by scattered light from the mask mark is in the highest in-focus state in the u-axis direction, corresponds to an intersection $P_1$ between the object plane 27 and mask surface shown in FIG. 2C. A distance between the positions $u_0$ and $u_1$ can be obtained, for example, through pattern matching of the two-dimensional images shown in FIG. 3.

By representing a length of a line segment $P_0$–$P_1$ as $L(P_0, P_1)$, a distance δ between the wafer 11 and mask 12 is given by:

$$\delta = L(P_0, P_1) \times \sin(\alpha) \quad (1)$$

where α is an angle between the optical axis 25 and the normal direction to the exposure surface. Therefore, the distance δ can be calculated from the length of the line segment $P_0$–$P_1$ by measuring a distance $L(u_0, u_1)$ between the positions $u_0$ and $u_1$ on the u-axis shown in FIG. 3. In order to calculate the distance δ correctly, it is preferable to measure the distance between the positions $u_0$ and $u_1$ on the u-axis correctly.

Instead of pattern matching between observed images, pattern matching with a prepared standard image may be performed. In this case, standard image signals are stored in advance in a memory which signals are obtained under the conditions that the wafer and mask are disposed so as to satisfy a desired positional relation therebetween. An image of a wafer mark formed by the stored standard image signals is subject to pattern matching with an image of an observed wafer mark, to thereby obtain a shift amount from a wafer reference position. Similarly, an image of a mask mark formed by the stored standard image signals is subject to pattern matching with an image of an observed mask mark, to thereby obtain a shift amount from a mask reference position. From these two shift amounts, the relative position between the wafer and mask can be known.

Figure 5A:
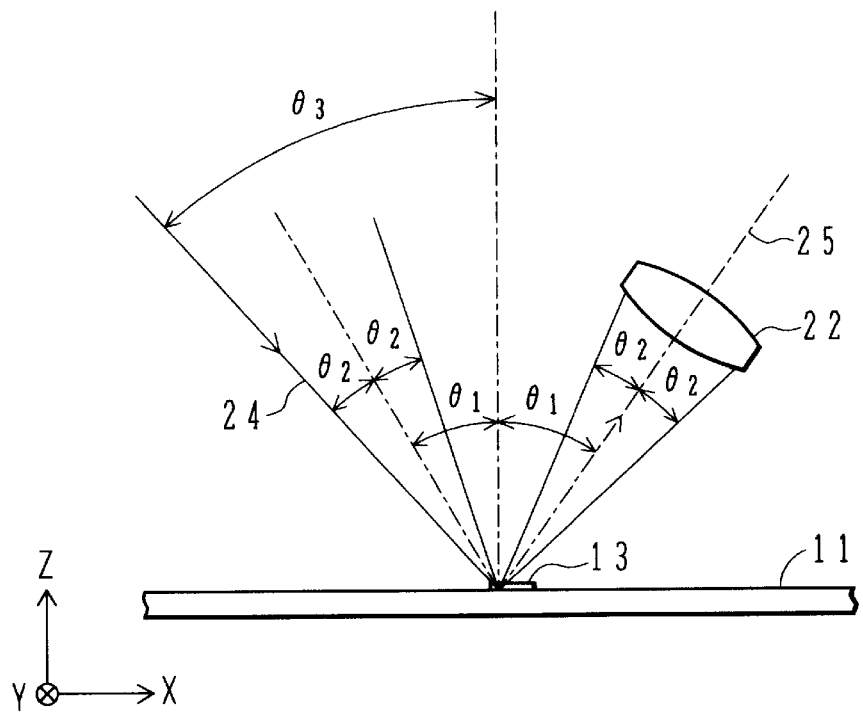
FIGS. 5A and 5B are schematic diagrams illustrating two examples of the positional relation between an illumination optical axis and an observation optical axis of the position detecting apparatus of the embodiment.

FIG. 5A is a schematic diagram showing a positional relation between the optical axis 24 of illumination light and the optical axis 25 of the lens 24, respectively of the position detecting apparatus shown in FIG. 1. An angle between the optical axis 25 of the lens 22 and the normal direction to the exposure surface of the wafer 11 is represented by $\theta_1$, an angular aperture of the lens 22 is represented by $2\theta_2$, and an angle between the optical axis 24 of illumination light and the normal direction to the exposure surface of the wafer 11 is represented by $\theta_3$. If the following relation is satisfied, $$\theta_3 > \theta_1 + \theta_2 \quad (2)$$

then regular reflection light of illumination light does not enter the entrance pupil of the lens 22. Therefore, a contrast between an image formed by scattered light from the alignment marks and a background can be increased. The following relation may be satisfied:

$$\theta_3 < \theta_1 - \theta_2 \quad (3)$$

However, in this case, it is difficult to dispose the illumination optical system such that the illumination optical system does not intercept the exposure light.

Figure 5B:
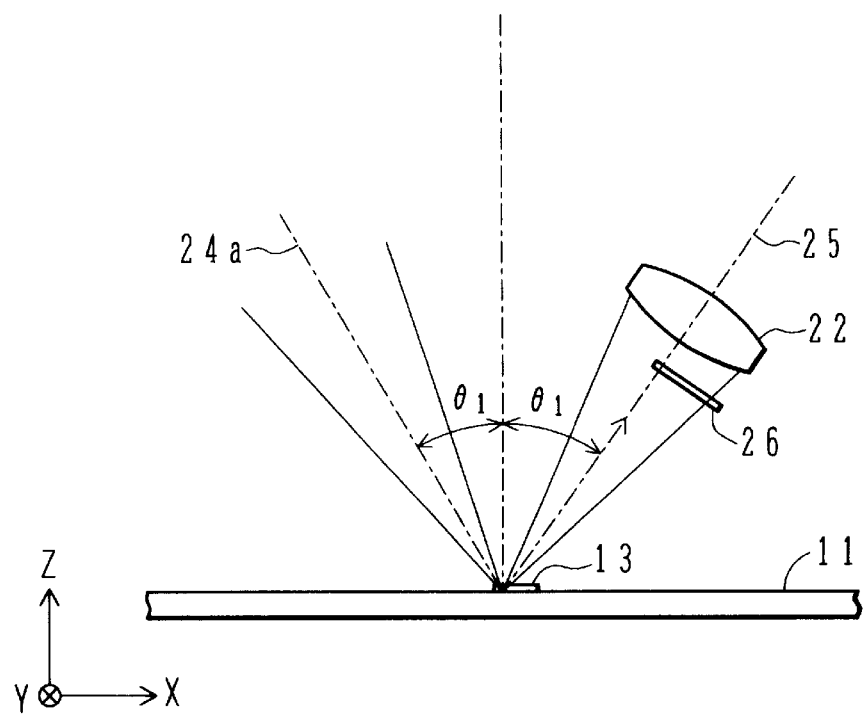

FIG. 5B shows another example of the configuration which prevents regular reflection light of illumination light from reaching the light reception surface 29 of the observation optical system 21. An angle between the optical axis 24a of illumination light and the normal to the exposure surface is equal to the angle $\theta_1$ between the optical axis 25 of the lens 22 and the normal direction to the exposure surface of the wafer 11. In this case, regular reflection light propagates within the angular aperture of the lens 22.

Light fluxes passing through the lower half of the lens 22 is intercepted by a light shielding member 26. A boundary in the aperture of the lens 22 between an area where light is intercepted by the light shielding member 26 and an area where light is not intercepted, is parallel to a direction along which edges of the wafer mark 13 to be observed extend, i.e., to the Y-axis direction shown in FIG. 2A By using the light shielding member 26, pseudo-dark-field observation becomes possible. Namely, even if the optical axis of illumination light and the optical axis of the observation optical system are disposed in symmetry with the normal to the exposure surface, pseudo-dark-field observation is possible. The configuration shown in FIG. 5B is effective for the case wherein the optical systems cannot be disposed so as to satisfy the formulas (2) and (3). It is possible to execute the pseudo-dark-field observation by placing a light shielding member at a pupil of the object lens to prevent 0-order reflected light from reaching the light reception surface.

In the above embodiment, the positions of the wafer 11 and mask 12 shown in FIG. 1 are detected in the Y-axis direction. By using three pairs of the observation optical system 20 and illumination optical system 23 shown in FIG. 1, the positions of the wafer 11 and mask 12 can be detected in the X-axis direction, Y-axis direction, and $\theta_z$ direction.

Figure 6:
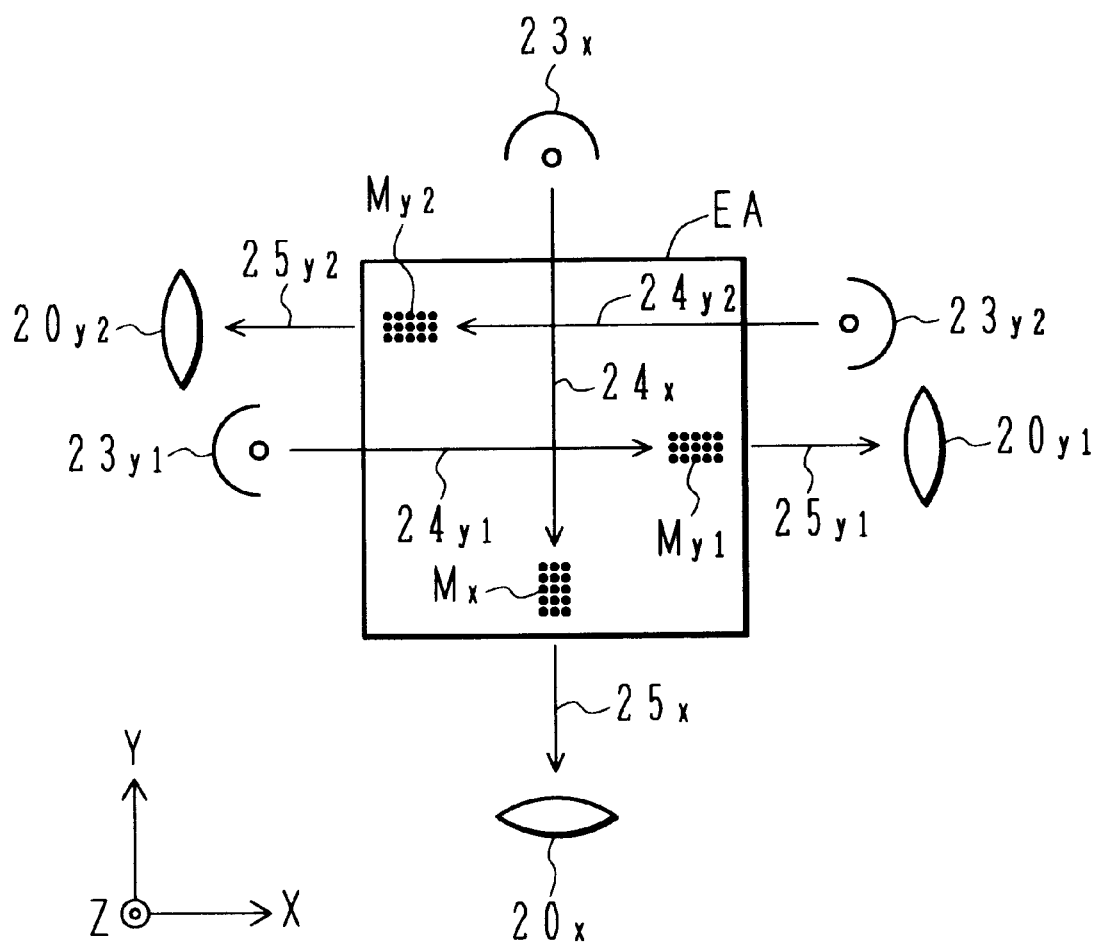
FIG. 6 is a schematic plan view of optical systems and an exposure area illustrating the positional relation between alignment marks and optical systems.

FIG. 6 is a schematic plan view showing the positional relation, in three pairs of optical systems, among alignment marks, illumination optical systems, and observation lenses. In an exposure area EA, an alignment mark $M_x$ for position alignment in the X-axis direction and alignment marks $M_{y1}$ and $M_{y2}$ for position alignment in the Y-axis direction are disposed. In FIG. 6, wafer marks and a mask mark are collectively shown by a single mark. With three alignment marks $M_x$, $M_{y1}$, and $M_{y2}$, the positions of the wafer 11 and mask 12 can be detected in the X-axis direction, Y-axis direction, and $\theta_z$ direction.

Illumination light is applied from illumination optical systems $23_x$, $23_{y1}$, and $23_{y2}$ to the alignment marks $M_x$, $M_{y1}$, and $M_{y2}$. Scattered light from the alignment marks $M_x$, $M_{y1}$, and $M_{y2}$ is observed with observation optical systems $24_x$, $24_{y1}$, and $24_{y2}$. Each illumination optical system and the corresponding observation optical system satisfy the positional relation illustrated in FIG. 1. The optical axis $24_x$ of the illumination optical system $23_x$ and the optical axis $25_x$ of the observation optical system $20_x$ are both parallel to the Y-X plane. The optical axes $24_{y1}$ and $24_{y2}$ of the illumination optical systems $23_{y1}$ and $23_{y2}$ and the optical axes $25_{y1}$ and $25_{y2}$ of the observation optical systems $24_{y1}$ and $24_{y2}$ are all parallel to the X-Z plane.

The optical axis $24_{y1}$ of the illumination optical system $23_{y1}$ and the optical axis $24_{y2}$ of the observation optical system $23_{y2}$ are slanted in opposite directions as viewed from the direction along the Y-axis.

Figure 7:
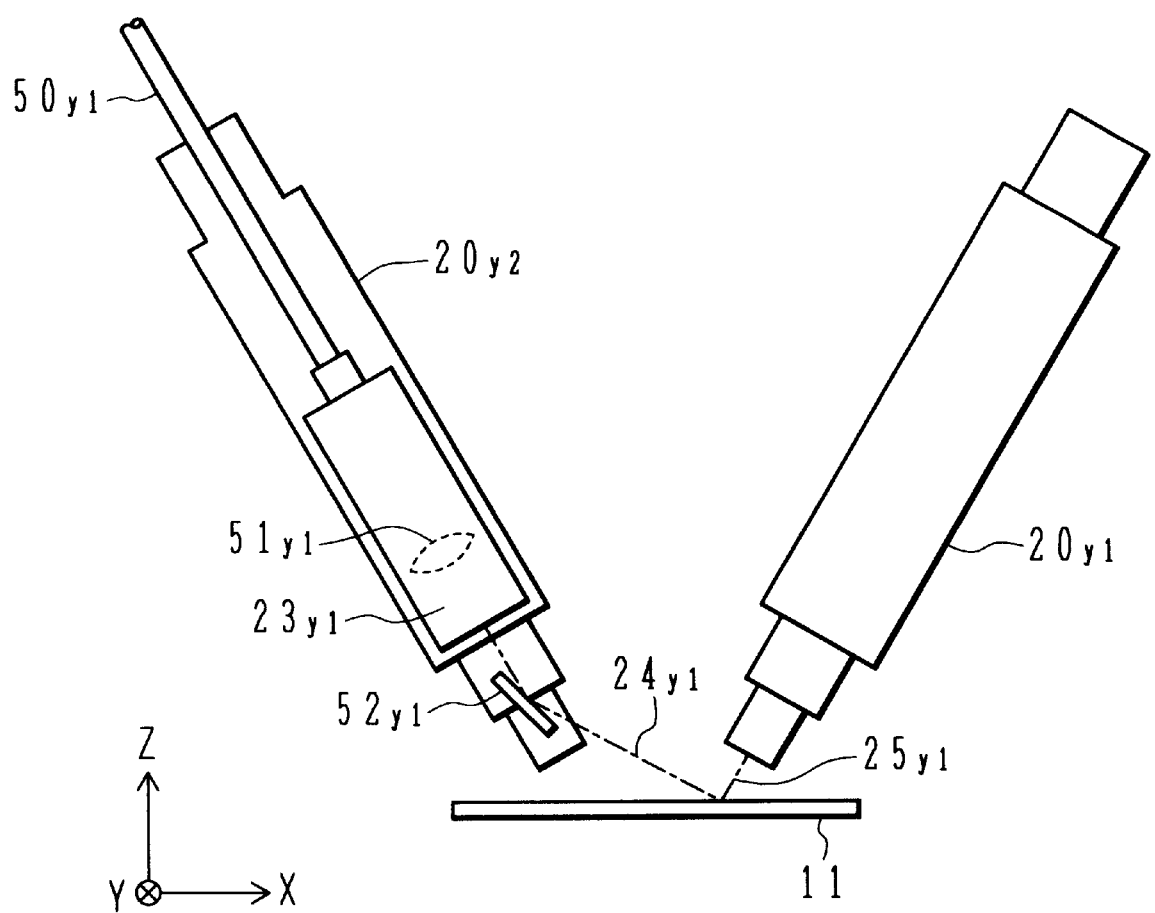
FIG. 7 is a front view of an illumination optical system and an observation optical system.

FIG. 7 is a front view showing an example of the configuration of the illumination optical system $23_{y1}$ and observation optical system $20_{y1}$ shown in FIG. 6. The illumination optical system $23_{y1}$ is constituted of an optical fiber $50_{y1}$, a converging lens $51_{y1}$, and a reflection mirror $52_{y1}$. Light propagated in the optical fiber $50_{y1}$ is converged by the converging lens $51_{y1}$, reflected by the reflection mirror $52_{y1}$, and converted into converged light fluxes parallel to the illumination optical axis $24_{y1}$.

The illumination optical system $23_{y1}$ is fixed to the observation optical system $20_{y2}$ shown in FIG. 6. Similarly, the illumination optical system $23_{y2}$ is fixed to the observation optical system $20_{y1}$. By fixing the illumination optical system and observation optical system corresponding to different alignment marks, the whole structure of optical systems can be simplified, and the apparatus can be made smaller.

The present invention has been described in connection with the preferred embodiments. The invention is not limited only to the above embodiments. It is apparent that various modifications, improvements, combinations, and the like can be made by those skilled in the art.

What is claimed is:

1. A position detecting apparatus comprising:
   an illumination optical system for applying illumination light to a wafer mark and a mask mark both for scattering incidence light for position alignment, the wafer mark being formed on an exposure surface of a wafer, the mask mark being formed on a mask surface of an exposure mask, and the illumination light being applied along an optical axis which is oblique relative to the exposure surface;
   an observation optical system having a light reception surface on which scattered light from the wafer mark and the mask mark is focussed, an optical axis of said observation optical system being slanted in a direction opposite to a direction of an optical axis of said illumination optical system, relative to a normal direction to the exposure surface of the wafer, and regular reflection light of the illumination light applied to the wafer and the mask from said illumination optical system being set so as not to become incident upon the light reception surface; and
   control means for controlling to detect a positional relation between the wafer and the mask in accordance with images formed by said observation optical system by using the scattered light from the wafer mark and the mask mark.

2. A position detecting apparatus according to claim 1, wherein a formula $\theta_3 > \theta_1 + \theta_2$ is satisfied, where an angle between a normal to the exposure surface and the optical axis of said observation optical system is represented by $\theta_1$, an angular aperture of an objective lens of said observation optical system is represented by $2\theta_2$, and an angle between the normal to the exposure surface and the optical axis of said illumination optical system is represented by $\theta_3$.

3. A position detecting apparatus according to claim 1, wherein another wafer mark is formed on the exposure surface of the wafer, another mask mark is formed on the mask surface of the exposure mask, and the position detecting apparatus further comprises:
   another illumination optical system for applying illumination light to the other wafer mark and the other mask mark, said other illumination optical system being fixed to said observation optical system, and the optical system of said other illumination optical system being parallel to an incidence plane of illumination light of said illumination optical system and being slanted in a direction opposite to a direction of the optical axis of said illumination optical system as viewed along a direction perpendicular to the incidence plane; and
   another observation optical system having a light reception surface on which scattered light from the other wafer mark and the other mask mark is focussed, said other observation optical system being fixed to said illumination optical system, an optical axis of said other observation optical system being slanted in a direction opposite to a direction of the optical axis of said other illumination optical system, relative to the normal direction to the exposure surface of the wafer, and regular reflection light of the illumination light applied to the wafer and the mask from said other illumination optical system being set so as not to become incident upon the light reception surface, wherein said control means controls to detect a positional relation between the wafer and the mask in accordance with images formed by said observation optical system and said other observation optical system by using the scattered light from the wafer mark and the mask mark.

4. A position detecting apparatus according to claim 2, wherein another wafer mark is formed on the exposure surface of the wafer, another mask mark is formed on the mask surface of the exposure mask, and the position detecting apparatus further comprises:

another illumination optical system for applying illumination light to the other wafer mark and the other mask mark, said other illumination optical system being fixed to said observation optical system, and the optical system of said other illumination optical system being parallel to an incidence plane of illumination light of said illumination optical system and being slanted in a direction opposite to a direction of the optical axis of said illumination optical system as viewed along a direction perpendicular to the incidence plane; and another observation optical system having a light reception surface on which scattered light from the other wafer mark and the other mask mark is focussed, said other observation optical system being fixed to said illumination optical system, an optical axis of said other observation optical system being slanted in a direction opposite to a direction of the optical axis of said other illumination optical system, relative to the normal direction to the exposure surface of the wafer, and regular reflection light of the illumination light applied to the wafer and the mask from said other illumination optical system being set so as not to become incident upon the light reception surface, wherein said control means controls to detect a positional relation between the wafer and the mask in accordance with images formed by said observation optical system and said other observation optical system by using the scattered light from the wafer mark and the mask mark.

5. A position detecting method comprising the steps of:

disposing a wafer with an exposure surface having a wafer mark formed thereon for scattering incidence light for position alignment and an exposure mask with a mask surface having a mask mark formed thereon for scattering incidence light for position alignment, the wafer and the exposure mask being faced each other with a predetermined distance being set between the exposure surface and the mask surface;

applying illumination light from an illumination optical system to the wafer mark and the mask mark along an optical axis which is oblique relative to the exposure surface;

observing images formed by scattered light from the wafer mark and the mask mark with an observation optical system, the observation optical system having a light reception surface on which scattered light from the wafer mark and the mask mark is focussed, an optical axis of the observation optical system being slanted in a direction opposite to a direction of an optical axis of the illumination optical system, relative to a normal direction to the exposure surface of the wafer, and regular reflection light of the illumination light applied to the wafer and the mask from the illumination optical system being set so as not to become incident upon the light reception surface; and controlling to detect a positional relation between the wafer and the mask in accordance with observation results at said observing step.

6. A position detecting apparatus according to claim 1, wherein the observation optical system further comprises an object lens through which the regular reflection light does not enter.

* * * * *